(12) United States Patent
Lin et al.

(10) Patent No.: US 9,718,164 B2
(45) Date of Patent: Aug. 1, 2017

(54) POLISHING SYSTEM AND POLISHING METHOD

(71) Applicant: TAIWAN SEMICONDUCTOR MANUFACTURING COMPANY, LTD., Hsinchu (TW)

(72) Inventors: Shih-Chi Lin, Hsinchu (TW); Kun-Tai Wu, Hsinchu (TW); You-Hua Chou, Hsinchu (TW); Chih-Tsung Lee, Hsinchu (TW); Min Hao Hong, Kaohsiung (TW); Chih-Jen Wu, Chu-Dong Town (TW); Chen-Ming Huang, Hsinchu (TW); Soon-Kang Huang, Hsinchu (TW); Chin-Hsiang Chang, New Taipei (TW); Chih-Yuan Yang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 556 days.

(21) Appl. No.: 13/706,506

(22) Filed: Dec. 6, 2012

(65) Prior Publication Data
US 2014/0162534 A1    Jun. 12, 2014

(51) Int. Cl.
| | | |
|---|---|---|
| B24B 37/04 | (2012.01) |
| B24B 37/30 | (2012.01) |
| H01L 21/304 | (2006.01) |
| H01L 21/02 | (2006.01) |
| H01L 21/673 | (2006.01) |
| H01L 21/677 | (2006.01) |
| B24B 37/20 | (2012.01) |
| H01L 21/66 | (2006.01) |

(52) U.S. Cl.
CPC ........ B24B 37/20 (2013.01); H01L 21/02021 (2013.01); H01L 21/02024 (2013.01); H01L 21/673 (2013.01); H01L 21/67703 (2013.01); H01L 22/26 (2013.01); *H01L 2924/0002* (2013.01)

(58) Field of Classification Search
CPC  B24B 1/00; B24B 49/00; B24B 37/00; B24B 37/005; B24B 37/02; B24B 37/04; B24B 37/042; B24B 37/20; B24B 37/26
USPC .................. 451/5, 8, 11, 41, 285–290, 43–44
See application file for complete search history.

(56) References Cited

U.S. PATENT DOCUMENTS 4,433,835 A * 2/1984 Wheeler ......................... 269/14
5,486,129 A   1/1996 Sandhu et al.
(Continued)

FOREIGN PATENT DOCUMENTS

| JP | 2011-093018 | 5/2011 |
| KR | 10-2000-0020877 | 4/2000 |
| KR | 10-2003-0053980 | 7/2003 |

OTHER PUBLICATIONS

Office Action dated Dec. 10, 2013 and English translation from corresponding application No. KR 10-2013-0023785.

*Primary Examiner* — Joseph J Hail
*Assistant Examiner* — J Stephen Taylor
(74) *Attorney, Agent, or Firm* — Hauptman Ham, LLP

(57) ABSTRACT

A polishing system for polishing a semiconductor wafer includes a wafer support for holding the semiconductor wafer, and a first polishing pad for polishing a region of the semiconductor wafer. The semiconductor wafer has a first diameter, and the first polishing pad has a second diameter shorter than the first diameter.

20 Claims, 13 Drawing Sheets

(56) References Cited

U.S. PATENT DOCUMENTS

| | | | |
|---|---|---|---|
| 5,542,874 A * | 8/1996 | Chikaki | 451/158 |
| 5,779,426 A * | 7/1998 | Ishikawa et al. | 414/223.02 |
| 5,931,722 A * | 8/1999 | Ohmi et al. | 451/271 |
| 6,179,695 B1 * | 1/2001 | Takahashi | B24B 27/0076 451/271 |
| 6,380,086 B1 * | 4/2002 | Robinson et al. | 438/692 |
| 6,431,959 B1 * | 8/2002 | Mikhaylich et al. | 451/41 |
| 6,527,621 B1 * | 3/2003 | Halley | 451/5 |
| 6,561,881 B2 * | 5/2003 | Jeong | 451/57 |
| 6,837,777 B2 * | 1/2005 | Ziemins | B08B 1/04 15/77 |
| 6,852,012 B2 * | 2/2005 | Vepa et al. | 451/41 |
| 7,273,824 B2 * | 9/2007 | Wu | B24B 9/065 257/E21.214 |
| 7,798,889 B2 * | 9/2010 | Nakiri | B24B 9/065 451/180 |
| 8,926,402 B2 * | 1/2015 | Nakanishi | B24B 21/002 451/296 |
| 2004/0048550 A1 * | 3/2004 | Halley | 451/5 |
| 2005/0250423 A1 * | 11/2005 | Nakamura | B24B 9/065 451/41 |
| 2006/0105678 A1 * | 5/2006 | Kohama et al. | 451/5 |
| 2009/0142992 A1 * | 6/2009 | Takahashi | B24B 9/065 451/9 |
| 2009/0156104 A1 * | 6/2009 | Kim | B24B 9/065 451/254 |
| 2009/0163119 A1 * | 6/2009 | Yamazaki | B24B 9/065 451/43 |
| 2009/0170406 A1 * | 7/2009 | Kato | B24B 9/065 451/44 |
| 2010/0093259 A1 * | 4/2010 | Lee et al. | 451/5 |
| 2010/0136884 A1 * | 6/2010 | Oh et al. | 451/5 |
| 2014/0065376 A1 * | 3/2014 | Venkatachalam | B24B 1/00 428/192 |
| 2014/0170388 A1 * | 6/2014 | Kashima | C03C 15/00 428/157 |

* cited by examiner

POLISHING SYSTEM AND POLISHING METHOD

BACKGROUND

Integrated circuits are typically fabricated on a semiconductor wafer, with many individual dies manufactured simultaneously on the same wafer. Processing steps are used to form layers of metal and dielectrics on the semiconductor wafer to define interconnect structures, as well as active and passive electronic devices. Many of the processing steps result in non-planar layers. However, it is often desirable for layers of the integrated circuit to have uniform thickness. Thus, polishing is required both to provide uniform thickness, and a smooth layer surface, which not only ensure device performance, but also aid subsequent processing steps.

Polishing techniques include mechanical planarization (MP) and chemical mechanical planarization/polishing (CMP). A typical CMP system will include a large polishing pad, on which a chemical slurry is introduced to facilitate wafer polishing, and a polishing head. To polish a semiconductor wafer, the semiconductor wafer is held by the polishing head, and the polishing head simultaneously applies a force to press the semiconductor wafer against the rotating polishing pad, while also rotating the semiconductor wafer.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
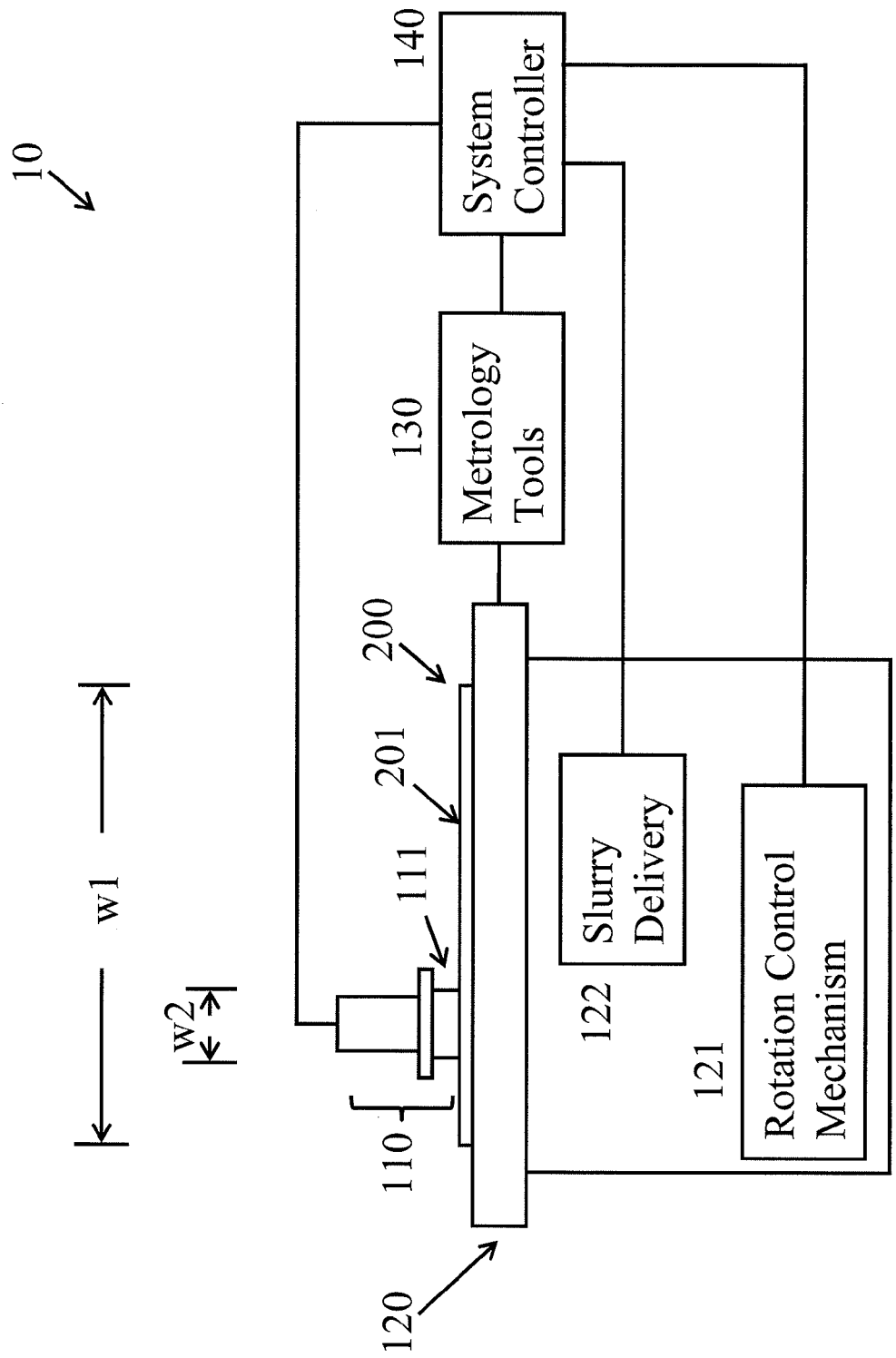
FIG. 1 is a diagram of a polishing system in accordance with various embodiments of the present disclosure.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a polishing system and the like. Other embodiments may also be applied, however, to other polishing systems which are used to polish material surfaces.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Polishing heads hold onto a circular semiconductor wafer by use of a retaining ring, and press the semiconductor wafer against a spinning polishing pad to planarize and/or polish a face of the semiconductor wafer. As the semiconductor wafer spins, due to the nature of angular motion, tangential velocity increases from the center of the semiconductor wafer to its edge. Thus, if the semiconductor wafer were pressed against the polishing pad by uniform pressure, edges of the semiconductor wafer would be polished more heavily than central regions. To address this issue, applicators are introduced in the polishing head to vary curvature of the semiconductor wafer during polishing, which compensates for the differences in tangential velocity over the radius of the semiconductor wafer. The applicators, which may include mechanical parts, such as springs or pistons, press against the semiconductor wafer to cause temporary curvature thereof. For various reasons, including aging, defects, and damage, the applicators do not perform as expected. As a result, the semiconductor wafer may exhibit uneven polishing after the polishing process is completed, which affects yield and throughput.

In the following disclosure, a novel polishing system is introduced, which uses a polishing pad having diameter smaller than the semiconductor wafer to achieve high uniformity when polishing the semiconductor wafer. In the polishing system disclosed herein, the semiconductor wafer may lie face-up on a table, while the polishing pad polishes the semiconductor wafer using a combination of a proper slurry and downward pressure. The polishing pad, being smaller than the semiconductor wafer, may sweep over the surface of the semiconductor wafer in a pattern that is programmable, or even adaptable based on in-line metrology data. Multiple polishing pads may be used sequentially, simultaneously, or in a combination of the two to increase flexibility and throughput.

The polishing system also provides a cleaning operation that can be performed without removing the semiconductor wafer to a separate cleaning station. After any polishing operation, a cleaning operation may be performed to remove excess slurry, for example. In the polishing system disclosed herein, the cleaning operation may be performed by a roller brush in combination with distilled water or a cleaning agent, for example. With the semiconductor wafer still face-up on the table, the roller brush is lowered onto the semiconductor wafer to clean the semiconductor wafer. Following the cleaning operation, further polishing operations may be performed using the polishing pad disclosed herein without removing the semiconductor wafer from the table.

The polishing pad in some embodiments also acts as an auxiliary polishing pad(s) in a rework operation to polish the semiconductor wafer in certain regions, while leaving other regions of the semiconductor wafer unaffected. The polishing pad is smaller than the semiconductor wafer, and is controllable in three dimensions. Taking metrology data following a first polishing process on a main polishing pad having a diameter greater than that of the semiconductor wafer, a second polishing profile can be programmed into the polishing system, and the auxiliary polishing pad can be used in conjunction with a polishing head to rework the semiconductor wafer under process, without taking the semiconductor wafer offline from the polishing system. Multiple small auxiliary polishing pads can be used in conjunction with the polishing head to provide even greater polishing profile flexibility and throughput. In some embodiments, a bevel polishing pad is also used in conjunction with the polishing head to polish a bevel region of the semiconductor wafer.

FIG. 1 is a diagram of a polishing system 10 in accordance with various embodiments of the present disclosure. A wafer table 120 supports and optionally rotates a semiconductor wafer 200 (or simply "wafer 200") to be polished. A polishing pad 111 of a polishing head 110 polishes a front face 201 of the semiconductor wafer 200. Width w2 (e.g., outer diameter) of the polishing pad 111 is shorter than width w1 (e.g., outer diameter) of the semiconductor wafer 200. In some embodiments, a rotation control mechanism 121 controls rotation of the wafer 200, and a slurry delivery mechanism 122 mixes, stores and/or delivers chemical slurry to the front face 201 of the wafer 200 to enable chemical mechanical polishing (CMP). Metrology tools 130 read parameters of the wafer 200 before, during, and/or after polishing of the wafer 200 by the polishing system 10. A system controller 140 controls variables of the polishing process performed by the polishing system 10.

In some embodiments, the semiconductor wafer 200 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor has a gradient SiGe feature in which the Si and Ge composition change from one ratio at one location to another ratio at another location of the gradient SiGe feature. In some embodiments, the gradient SiGe feature is formed over a silicon substrate. In some embodiments, the gradient SiGe feature is strained. Furthermore, in some embodiments, the semiconductor wafer 200 is a semiconductor on insulator, such as a silicon on insulator (SOI), or a thin film transistor (TFT). In some examples, the semiconductor wafer 200 includes a doped epitaxial layer or a buried layer. In other examples, the compound semiconductor wafer 200 has a multilayer structure, or the wafer 200 may include a multilayer compound semiconductor structure. In some embodiments, the semiconductor wafer 200 includes an epitaxial layer. For example, the wafer 200 has an epitaxial layer overlying a bulk semiconductor. Furthermore, in some embodiments, the wafer 200 includes a semiconductor-on-insulator (SOI) structure such as a buried dielectric layer. Alternatively, the wafer 200 includes a buried dielectric layer such as a buried oxide (BOX) layer, such as that formed by a method referred to as separation by implantation of oxygen (SIMOX) technology, wafer bonding, selective epitaxial growth (SEG), or other proper method.

In some embodiments, the semiconductor wafer 200 includes active and/or passive devices formed thereon and therein. For example, doped regions are formed in the semiconductor wafer 200 to define transistors. In some embodiments, dielectric and polysilicon layers are defined to form gates of the transistors. In some embodiments, additional metal and polysilicon layers are patterned to form interconnects between the active and/or passive devices in and on the semiconductor wafer 200. In some embodiments, other structures, such as through-substrate-vias (TSVs), post-passivation redistribution layers (PPI RDLs), and the like are also formed on the semiconductor wafer 200. The various devices and interconnect structures may primarily be formed on a front face 201 of the semiconductor wafer 200. In the polishing system 10, the front face 201 may face toward polishing head 110, while a back face of the semiconductor wafer 200 may face away from polishing head 110, and be in contact with the wafer table 120.

The wafer table 120 supports the wafer 200, and in some embodiments has a wafer contacting surface made of a material such as silica gel. For the wafer 200 having the width w1, the wafer table 120 may be of width greater than the width w1 by at least 20 cm, for example. In some embodiments, the width w1 is in a range of about 25 millimeters to about 450 millimeters. In some embodiments, the width w1 exceeds 450 millimeters. Examples of the width w1 include 300 millimeters and 450 millimeters.

The wafer table 120 may spin the semiconductor wafer 200 at a first rate and in a first direction. Spin variables of the semiconductor wafer 200, such as speed and direction, may be controlled by the rotation control mechanism 121. In some embodiments, the rotation control mechanism 121 is controlled by the system controller 140. In some embodiments, the rotation control mechanism 121 causes rotation of the semiconductor wafer 200 through an electric motor. In some embodiments, the electric motor is an alternating current (AC) motor, a direct current (DC) motor, a universal motor, or the like, and has fixed or variable speed. In some embodiments, the rotation control mechanism 121 includes electronics for setting the speed of the electric motor. In some embodiments, the electronics receive control signals from the system controller 140, and control the speed of the electric motor in response to the control signals. In some embodiments, the control signals are real-time speed indication signals, and/or a spin rate profile specifying rotation speeds of the semiconductor wafer 200 over time throughout a polishing process. Embodiments in which the rotation control mechanism 121 is optional are also contemplated herein, for example when the semiconductor wafer 200 is not rotated during polishing, but is stationary on the wafer table 120.

Figure 2:
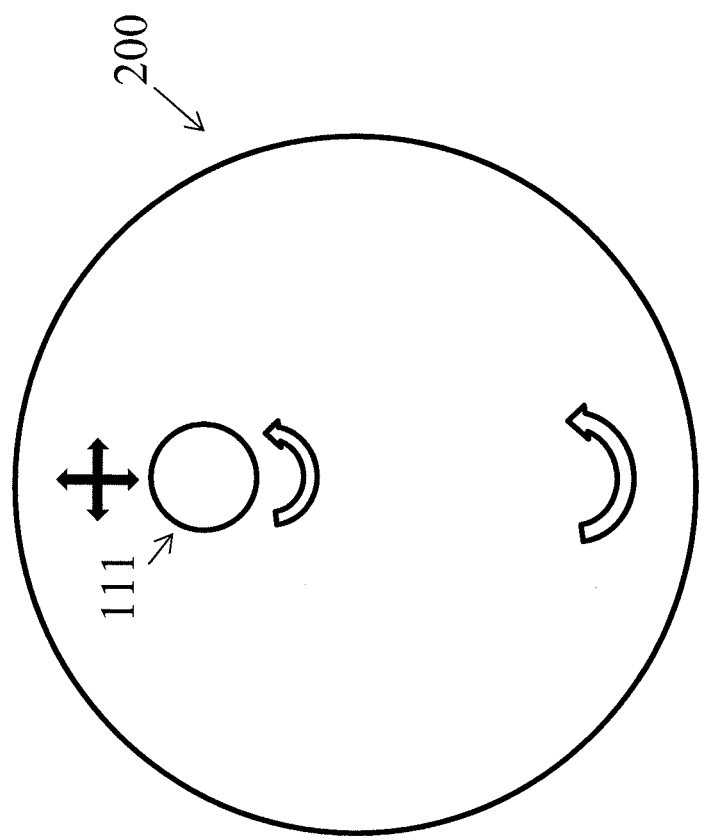
FIG. 2 is a top view of a polishing pad capable of translation and rotation in accordance with various embodiments of the present disclosure.

The polishing head 110 holds the polishing pad 111, and is controllable by the system controller 140 to apply pressure to the wafer 200 through the polishing pad 111. The system controller 140 is also capable of translating the polishing pad 111 through three dimensions as shown in FIG. 2, and also rotating the polishing pad 111 at a second rate and in a second direction. The polishing head 110 is controllable by the system controller 140 (for example) to translate in the three dimensions relative to the front face 201. Two dimensions are indicated by crossing arrows in FIG. 2, with the third dimension being in and out of the figure, orthogonal to the axes depicted by the crossing arrows. In some embodiments, the polishing pad 111 spins at the second rate and in the second direction (clockwise or counterclockwise), which is be the same or different than the first rate and the first direction of the wafer 200. In some embodiments, the second rate is fixed or variable, and is programmable and/or adjustable based on in-line metrology feedback provided by the metrology tools 130. In some embodiments, the second rate is set in real-time by the system controller 140, and/or as a predefined profile specifying rotation rates and directions of the polishing pad 111 over time throughout the polishing process.

A polishing surface of the polishing pad 111 faces toward the front face 201 of the semiconductor wafer 200. In some embodiments, the polishing pad 111 polishes the semiconductor wafer 200 through a combination of mechanical and chemical removal of layer material. In some embodiments, the polishing pad 111 is made of a polymer. The width w2 of the polishing pad 111 is shorter than the width w1 of the semiconductor wafer 200. In some embodiments, the width w2 is less than half the width w1. In some embodiments, the width w2 is between ¼ and ⅓ of the width w1. In some embodiments, the polishing pad 111 is cylindrical in shape, with a circular cross-section relative to the plane of the front face of the wafer 200. Other shapes for the cross-section of the polishing pad 111, including ovals, rectangles, squares, and the like, are also contemplated herein.

In some embodiments, the slurry delivery mechanism 122 mixes, stores and/or delivers chemical slurry to the front face 201 of the wafer 200 to enable chemical mechanical polishing (CMP). In FIG. 1, the slurry delivery mechanism 122 is shown as part of the wafer table 120. In some embodiments, the slurry delivery mechanism 122 is part of the polishing head 110. In some embodiments, the chemical slurry is applied to the wafer 200 through the wafer table 120, and/or through the polishing pad 111. For example, the chemical slurry is fed through a tube to the polishing pad 111 through the polishing head 110. In some embodiments, the chemical slurry is also fed through a tube onto the front surface 201 of the wafer 200 through a tube of the wafer table 120. In some embodiments, composition of the chemical slurry is controlled by the slurry delivery mechanism 122 according to a control signal generated by the system controller 140. In some embodiments, the control signal provides real-time composition control parameters, and/or a predefined composition profile that is scheduled relative to the duration of the polishing process. In some embodiments, other slurry variables, such as flow rate, are also controlled by the slurry delivery mechanism 122 according to control signals generated by the system controller 140, in real-time and/or in a predefined profile. In some embodiments, the various control signals related to slurry composition and other slurry variables are generated as preset values, and/or in view of in-line metrology data gathered by the metrology tools 130 during the polishing process.

The metrology tools 130 provide metrology information to the system controller 140, including topography of the front face 201 of the semiconductor wafer 200, for example. Thicknesses and contours of films and materials on the face of the semiconductor wafer 200 are measured by the metrology tools 130, and transmitted to the system controller 140. The metrology tools 130 include a laser interferometer, for example. Based on the metrology information provided to the system controller 140, in some embodiments, the system controller 140 controls various process variables during the polishing process. Examples of process variables controllable by the system controller 140 include rotation speeds and directions of the wafer 200 and the polishing pad 111, location of the polishing head 110 over the wafer 200, force applied by the polishing head 110 on the wafer 200, and slurry pumping rate and/or slurry composition of the slurry delivery mechanism 122. The use of the metrology tools 130 as described is referred to as intra-metrology closed loop control (IMCLC).

Figure 3B:
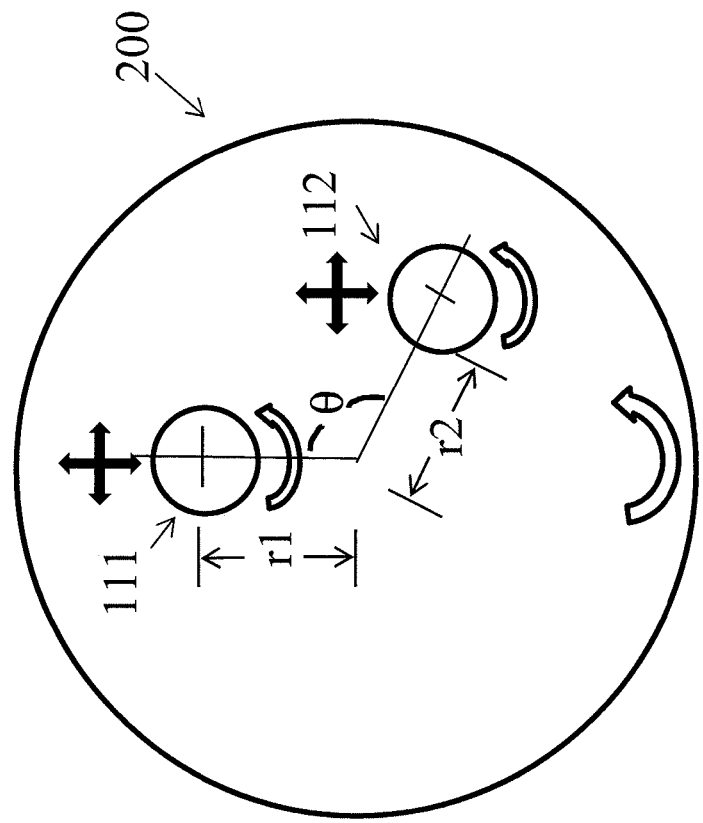
FIGS. 3A and 3B are top views of multiple polishing pads used in the polishing system in accordance with various embodiments of the present disclosure.
Figure 3A:
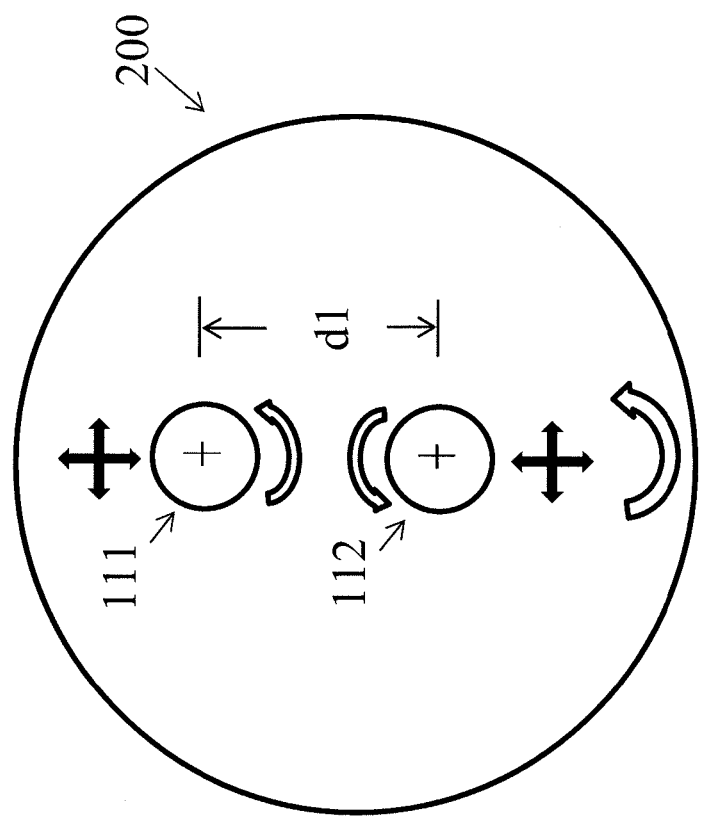

In some embodiments, a second polishing pad 112 is utilized in the polishing system 10 to increase throughput as shown in FIGS. 3A and 3B. In FIG. 3A, according to some embodiments, the second polishing pad 112 and the polishing pad 111 are collinear along center lines thereof, and separated by a distance d1 (e.g., as measured from center of pad 112 to center of pad 111), which is about half the diameter w1 of the semiconductor wafer 200. FIG. 3B shows a general case, in which positions of the polishing pads 111, 112 are defined in radial coordinates. As such, the polishing pad 111 is located at a radius r1 relative to the center of the wafer 200, and the polishing pad 112 is located at a radius r2 relative to the center of the wafer 200. The radii r1, r2 are further separated angularly by an offset angle θ. In the example shown in FIG. 3A, the offset angle θ is 180 degrees. The variables d1, r1, r2, and θ are all controllable by the system controller 140, and in some embodiments, are set in a predetermined polishing profile, and/or in a real-time response to the in-line metrology data provided by the metrology tools 130.

Figure 4:
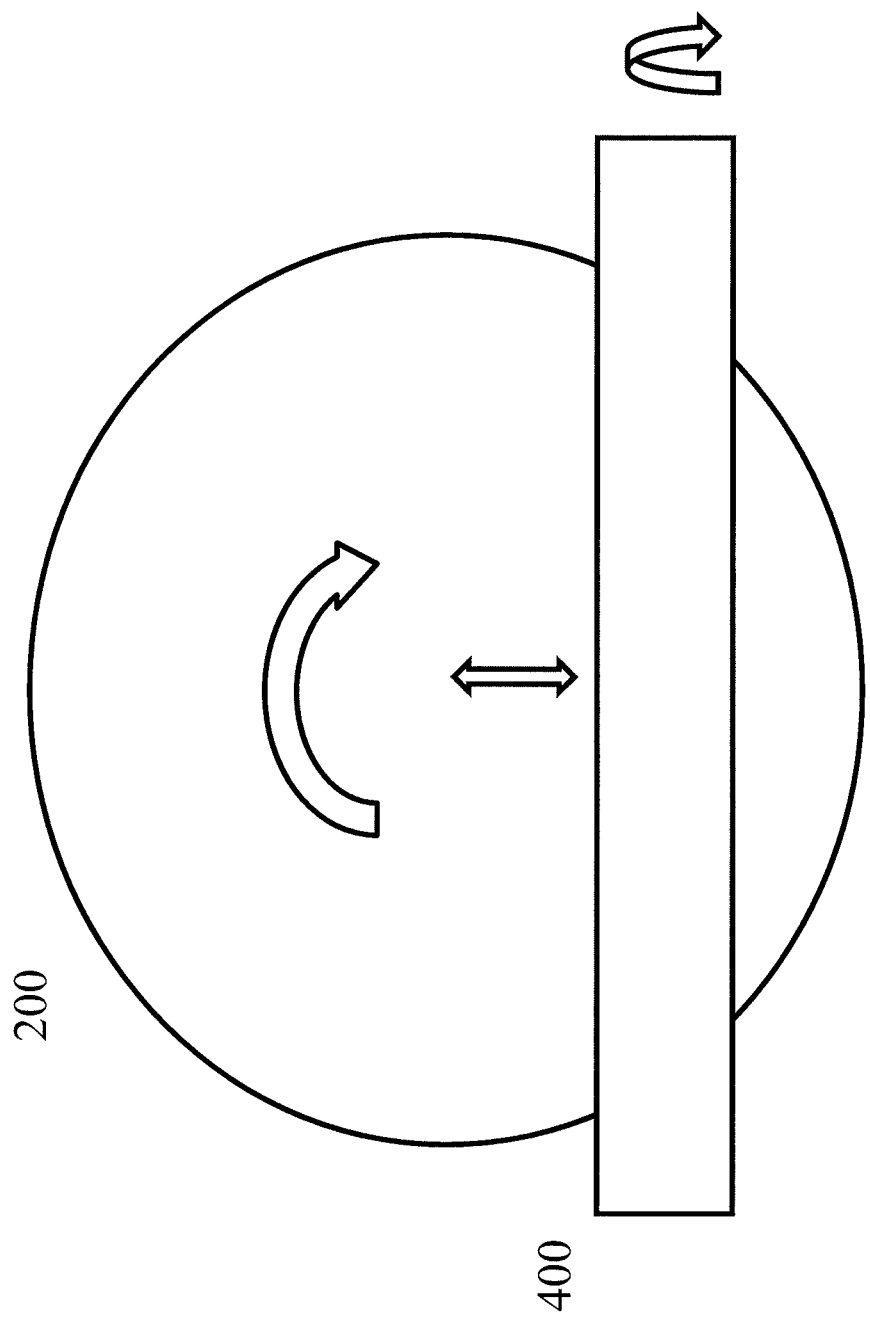
FIG. 4 is a top view of a polishing pad including a cleaning sub-system in accordance with various embodiments of the present disclosure.

In some embodiments, cleaning is performed between polishing stages, and includes use of brushes and cleaning agents (e.g., chemicals, deionized (DI) water). A cleaning unit 400 in accordance with various embodiments of the present disclosure is shown in FIG. 4. In some embodiments, the cleaning unit 400 is a roller brush or disc brush, for example, and is configured to rotate and translate in at least one direction, as indicated by arrows to the right and above the cleaning unit 400 in FIG. 4. In some embodiments, the semiconductor wafer 200 is held face up by the wafer table 120, and is further rotated while the cleaning unit 400 clears chemical slurry and particles from the face of the semiconductor wafer 200.

Figure 5:
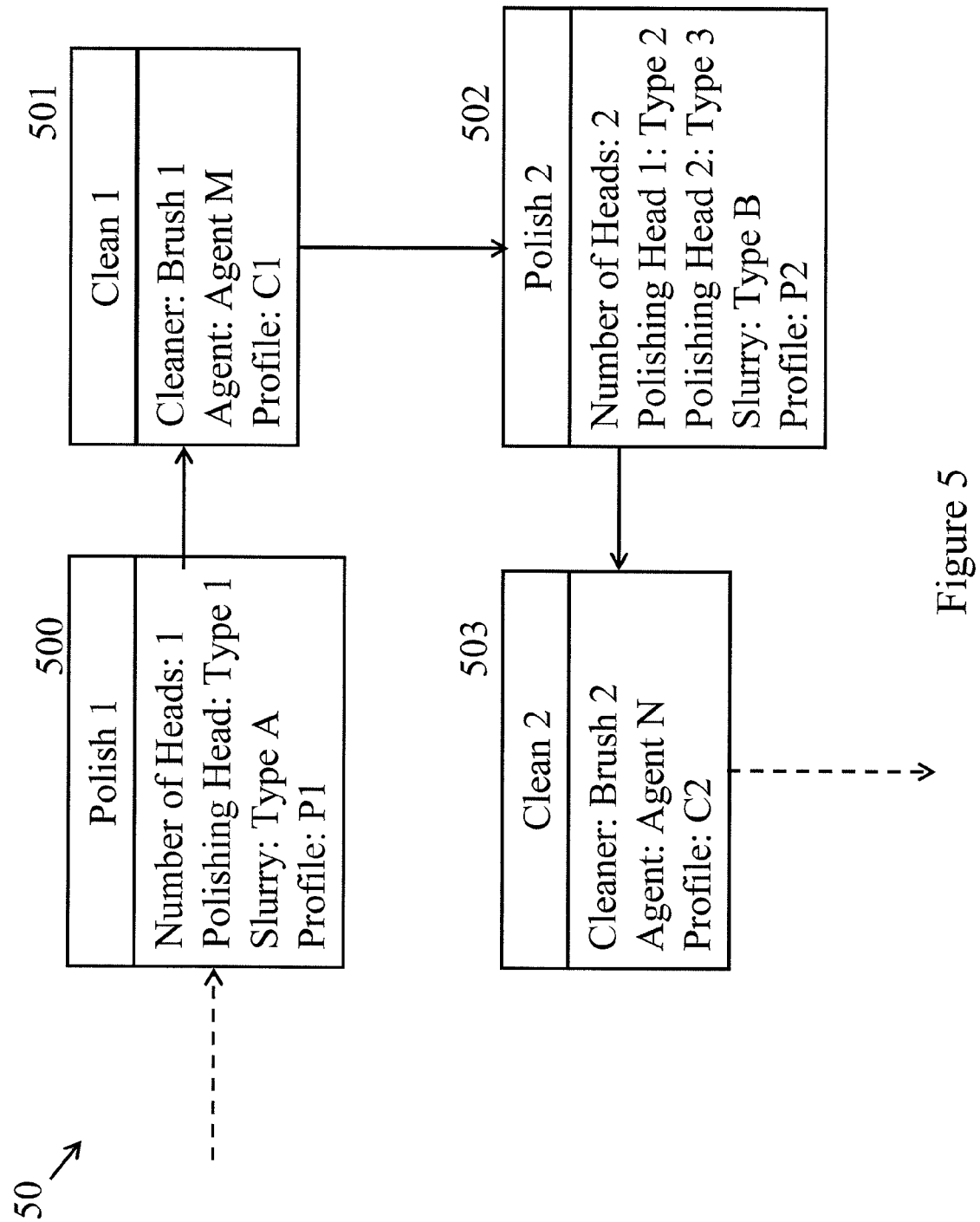
FIG. 5 is a flowchart of a polishing process in accordance with various embodiments of the present disclosure.

Based on the above, intermediate steps in a general polishing method 50 are shown in FIG. 5. Described in terms of FIGS. 1-2, 3A-3B, and 4, the polishing method 50 includes a first polishing process performed in block 500, a first cleaning process performed in block 501, a second polishing process performed in block 502, and a second cleaning process performed in block 503. It is understood that the second polishing and cleaning processes or the first polishing and cleaning processes are optional in some embodiments. Order of the blocks 500-503 may also be changed to form various embodiments, all of which are contemplated herein. For example, blocks 502 and 503 are performed prior to blocks 500 and 501 in some embodiments.

One polishing head is used to polish the wafer 200 in block 500. In some embodiments, the polishing head is of a first type (e.g., Type 1), and is used with a first chemical slurry (e.g., Type A). In some embodiments, a first profile P1 is used that defines polishing speeds, polishing pressures, polishing positions, durations, slurry composition and flow rate, and the like, as described above.

Following block 500, the first cleaning process is performed in block 501. A first cleaner, such as a brush (e.g., Brush 1), is used with a first cleaning agent (e.g., Agent M) to clean the polished surface of the wafer 200 by the first cleaning process in block 501. In some embodiments, the cleaning agent is selected in accordance with the chemical slurry used in block 500. In some embodiments, a cleaning profile C1 defines rotation speeds, positions, durations, flow rates, and the like to provide sufficient and/or optimal cleaning of the wafer 200.

Two polishing heads are used in block 502. In some embodiments, he polishing heads are the same or a different type (e.g., Type 2 and Type 3), and are used with a chemical slurry of a type (e.g., Type B) that is the same or different from the type of the chemical slurry used in the block 500. In some embodiments, a second polishing profile P2 is defined for use with the polishing heads and slurry of block 502, which defines polishing rates, flow rates, polishing positions of the polishing heads (e.g., radii and angular separation), durations, pressures, and the like.

A second cleaning process is performed in block 503 to clear away residual slurry from the polishing process in block 502. In some embodiments, a second cleaner (e.g., Brush 2) is used with a second cleaning agent (e.g., Agent N) in accordance with a second cleaning profile C2 to remove the residual slurry. In some embodiments, the second cleaner is the same or different from the first cleaner, and cleaners other than brushes are also contemplated herein. In some embodiments, the second cleaning agent is the same or different from the first cleaning agent, and is selected in accordance with the chemical slurry used in block 502. The cleaning profile C2 may define rotation speeds, positions, durations, flow rates, and the like to provide sufficient and/or optimal cleaning of the wafer 200.

In some embodiments, the cleaning processes in blocks 501 and 503 described above utilize the cleaning unit 400. In some embodiments, the cleaning unit 400 is spun and lowered onto the semiconductor wafer 200 surface, and pressure is applied to the cleaning unit 400 toward the face of the semiconductor wafer 200. In some embodiments, the cleaning unit 400 begins cleaning at an edge of the semiconductor wafer 200, such as the bottom edge shown in FIG. 4, and is translated toward an opposite edge in a single direction, for example. Embodiments where the cleaning unit 400 is pivoted from one end thereof to swipe angularly across the face of the semiconductor wafer 200 are also contemplated herein. In some embodiments, a cleaning chemical solution and/or DI water is deposited on the face of the semiconductor wafer 200 to aid in removing all residue from the semiconductor wafer 200.

The polishing system 10 using the polishing head 110 saves space over traditional polishing systems. The polishing pads 111, 112 allow for numerous polishing profiles to be used, and in some embodiments are tied in with the in-line metrology data provided by the metrology tools 130 to provide automated profile adjustment without taking the semiconductor wafer 200 offline. The cleaning unit 400 in the polishing system 10 also saves time, eliminating the need for offline cleaning stations. In some embodiments, the semiconductor wafer 200 is polished and cleaned in the same station, which saves space and greatly reduces wafer transfer time. The polishing system 10 saves space and time, and has flexible polishing profile control, which translates into an increase in both yield and throughput.

Figure 6:
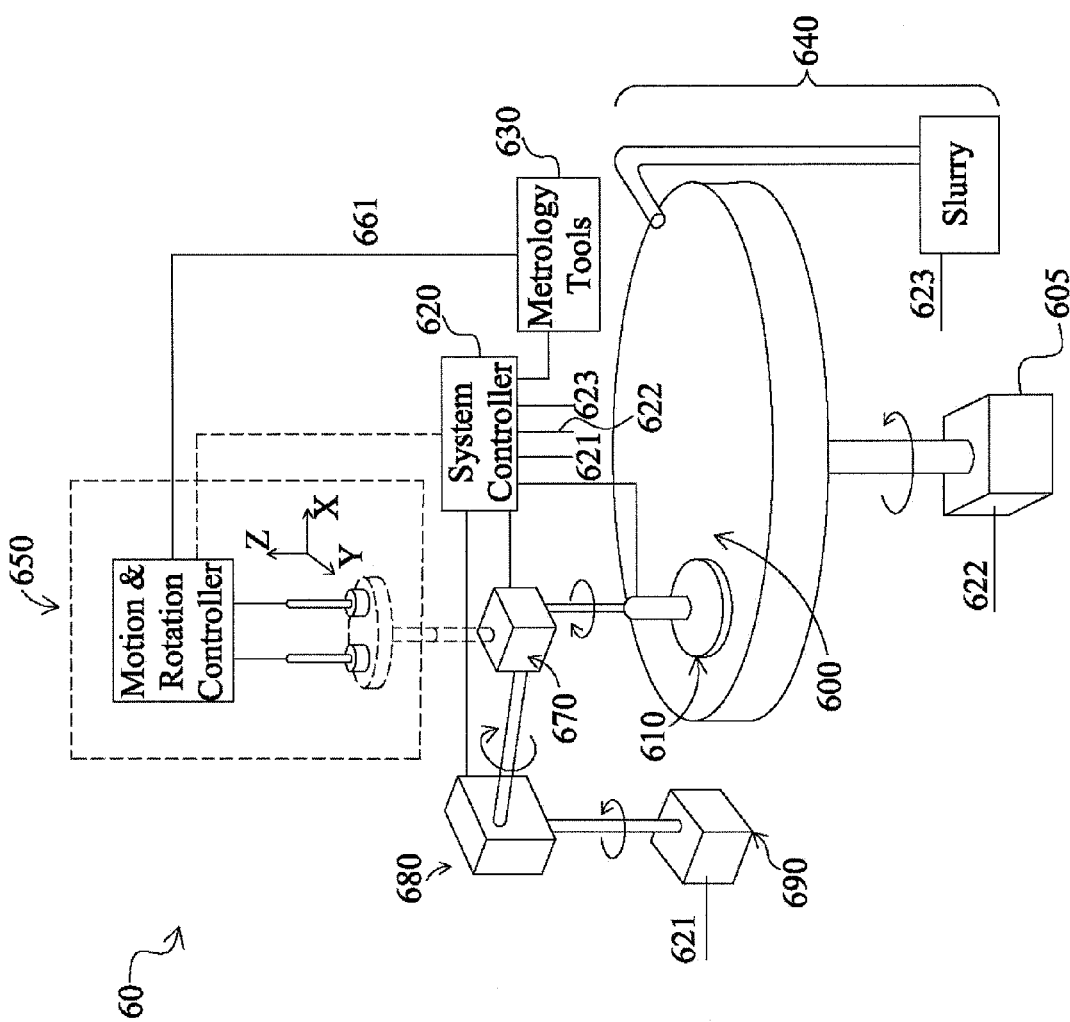
FIG. 6 is a diagram of a polishing system in accordance with various embodiments of the present disclosure.

A polishing system 60 in accordance with various embodiments of the present disclosure is shown in FIG. 6. A main polishing pad 600 for polishing a wafer has a polishing face, which is made of polyurethane, for example. The main polishing pad 600 is rotated at a constant speed, or at a variable speed determined by a system controller 620. The rotation is controlled by a motor 605 that drives the main polishing pad 600, for example. The variable speed controlled based on a signal 622 sent to the motor 605 from the system controller 620, and the motor 605 may vary the rotational speed of the main polishing pad 600 in response to the signal. The main polishing pad 600 may rotate in a clockwise direction or a counter-clockwise direction. The main polishing pad 600 is circular, for example, and has a diameter greater than a semiconductor wafer to be polished. In some embodiments, the diameter of the main polishing pad 600, $D_{PAD}$, is at least two times as long as the diameter of the semiconductor wafer, $D_{WAFER}$. Exemplary main polishing pad diameter for a 450 mm semiconductor wafer is about 1094 mm ($D_{PAD}/D_{WAFER}$ approximately 2.43), compared with main polishing pad diameter of about 762 mm for 300 mm wafers ($D_{PAD}/D_{WAFER}$ approximately 2.54) and main polishing pad diameter of about 508 mm for 200 mm wafers ($D_{PAD}/D_{WAFER}$ approximately 2.54).

Figure 7:
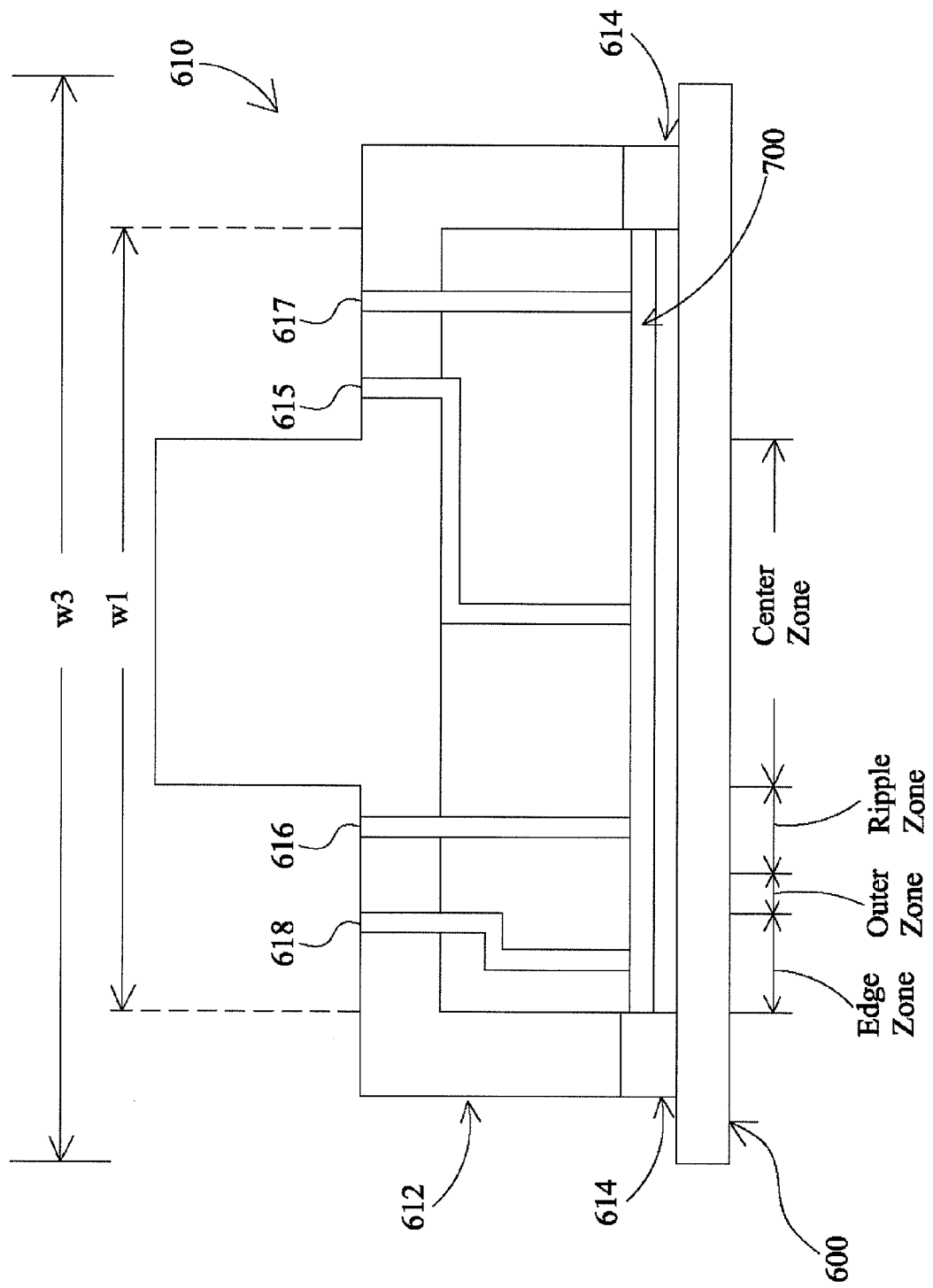
FIG. 7 is a diagram of a polishing head of the polishing system in accordance with various embodiments of the present disclosure.
Figure 10:
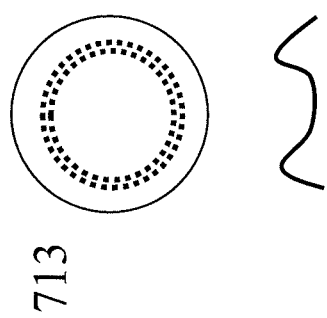
FIGS. 8 to 13 are illustrations of wafer contours following completion of a first polishing process in accordance with various embodiments of the present disclosure.

A polishing head 610, shown in detail in FIG. 7, presses a wafer 700, such as a semiconductor wafer, against the main polishing pad 600. The semiconductor wafer 700 has width $w_1$ which is typically shorter than half width $w_3$ of the main polishing pad 600, as described above. The polishing head 610 has a retainer ring 614 installed in a frame 612 thereof. The retainer ring 614 is made of polyphenylene sulfide (PPS), polyether ether ketone (PEEK) or another suitable polyimide or thermoplastic material, and holds the semiconductor wafer 700 by an edge/bezel region of the semiconductor wafer 700. In some embodiments, the polishing head 610 applies a general force on the semiconductor wafer 700 toward the main polishing pad 600. Applicators 615-618 provide localized pressure at various regions of the semiconductor wafer 700 to change the contour of the semiconductor wafer 700, and control polishing rates of the various regions of the semiconductor wafer 700. The applicator 615 applies pressure to a center zone of the semiconductor wafer 700, the applicator 616 applies pressure to a ripple zone of the semiconductor wafer 700, the applicator 617 applies pressure to an outer zone of the semiconductor wafer 700, and the applicator 618 applies pressure to an edge zone of the semiconductor wafer 700, as shown in FIG. 7. The pressures applied are mechanical, pneumatic, fluid, or the like, and are controllable by the system controller 620.

In some embodiments, in addition to pressing the semiconductor wafer 700 against the main polishing pad 600, the polishing head 610 further rotates in a direction the same or opposite that of the main polishing pad 600. In some embodiments, the main polishing pad 600 rotates clockwise, while the polishing head 610 rotates counterclockwise, for example. In some embodiments, the main polishing pad 600 rotates clockwise, while the polishing head 610 also rotates clockwise. In some embodiments, rotation of the polishing head 610 is controlled by a motor 670 that drives the polishing head 610. In some embodiments, the motor 670 rotates the polishing head 610 at a constant speed, or at a variable speed controllable by the system controller 620. In some embodiments, the polishing head 610 is also subject to translation in a plane coplanar to the face of the main polishing pad 600. In some embodiments, the translation is controllable by the system controller 620, and is programmed into the polishing system 60 as part of a predefined polishing profile.

In some embodiments, the polishing system 60 is a chemical mechanical polishing (CMP) system, for example. In some embodiments, a slurry delivery system 640 releases a chemical slurry onto the main polishing pad 600 surface at a constant rate, or a variable rate determined by the system controller 620. In some embodiments, the slurry delivery system 640 includes a pump, and a tube installed in the main polishing pad 600. In some embodiments, the chemical slurry includes silica solids, chemical dispersants, surfactants, and the like. In some embodiments, composition of the chemical slurry is also controllable by the system controller 620. In some embodiments, the system controller 620 controls slurry delivery parameters, such as delivery rate and slurry composition through a signal 623.

Metrology tools 630 provide metrology information to the system controller 620, including topography of the face of the semiconductor wafer 700, for example. Thicknesses and contours of films and materials on the face of the semiconductor wafer 700 are measured by the metrology tools 630, and transmitted to the system controller 620. The metrology tools 630 include a laser interferometer, for example. In some embodiments, based on the metrology information provided to the system controller 620, the system controller 620 controls rotation speeds of the main polishing pad 600 and the polishing head 610, location of the polishing head 610 over the main polishing pad 600, force applied by the polishing head 610, pressure levels of the applicators 615-618, and slurry pumping rate and/or slurry composition of the slurry delivery system 640. The use of the metrology tools 630 as described is referred to as intra-metrology closed loop control (IMCLC).

The system controller 620 controls the main polishing pad 600, the polishing head 610, and the slurry delivery system 640 to perform a first polishing process. In some embodiments, the first polishing process is based on a first pre-defined polishing profile, which specifies polishing time, as well as polishing variables including, but not limited to, rotation speeds of the main polishing pad 600 and the polishing head 610, translation of the polishing head 610, force of the polishing head 610, regional pressure levels of the applicators 615-618, and slurry rate and composition variables of the slurry delivery system 640 as a function of time. In some embodiments, rotation speed of the polishing head 610 varies over the duration of the first polishing process. In some embodiments, a path is set for the polishing head 610 to use the entire area of the main polishing pad 600 through the first polishing process, for example. In some embodiments, the first polishing process is adaptive, making use of the IMCLC to control the polishing variables in response to metrology metrics including, but not limited to, layer thickness and layer smoothness.

Figure 9:
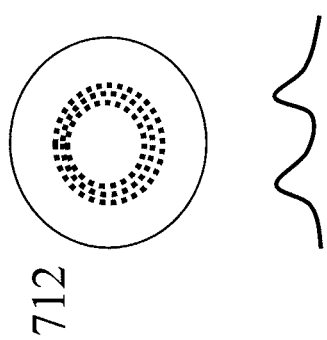
Figure 8:
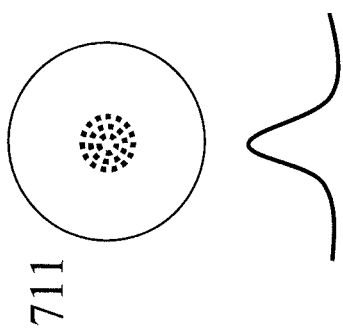

Upon completion of the first polishing process, metrology data provided by the metrology tools 630 may indicate that at least one zone of the face of the semiconductor wafer 700 under process is not evenly polished. FIGS. 8-13 are illustrations of wafer contours 711-716 following completion of the first polishing process. In FIG. 8, a central region of the semiconductor wafer 700 is polished less, e.g. has greater layer thickness, than outer and edge regions of the semiconductor wafer 700. This may indicate that the applicator 615 is defective, damaged, aging, or requires maintenance. In FIG. 9, the semiconductor wafer contour 712 may indicate that the ring zone of the semiconductor wafer 700 is underpolished relative to other zones of the semiconductor wafer 700. The applicator 616 is defective, damaged, aging, or require maintenance, for example. The semiconductor wafer contours 713 and 714 in FIG. 10 and FIG. 11, respectively, indicate underpolishing in the outer zone and the edge zone, which may correspond to improper function of the applicators 617 and 618. The semiconductor wafer contour 715 in FIG. 12 corresponds to underpolishing in two zones, such as the ring zone and the edge zone. Other two-zone contours may include underpolishing in the center zone and the outer zone, and underpolishing in the center zone and the edge zone. A wafer contour 716 shown in FIG. 13 corresponds to a case in which at least one area of the semiconductor wafer 700 has, for example, higher thickness than originally programmed into the polishing system 60 for the first polishing process. The high thickness(es) is die localized in FIG. 13, affecting, for example, a single die, or at least two adjacent dies located in a roughly circular or other shaped region that is non-concentric to the semiconductor wafer 700.

Figure 14:
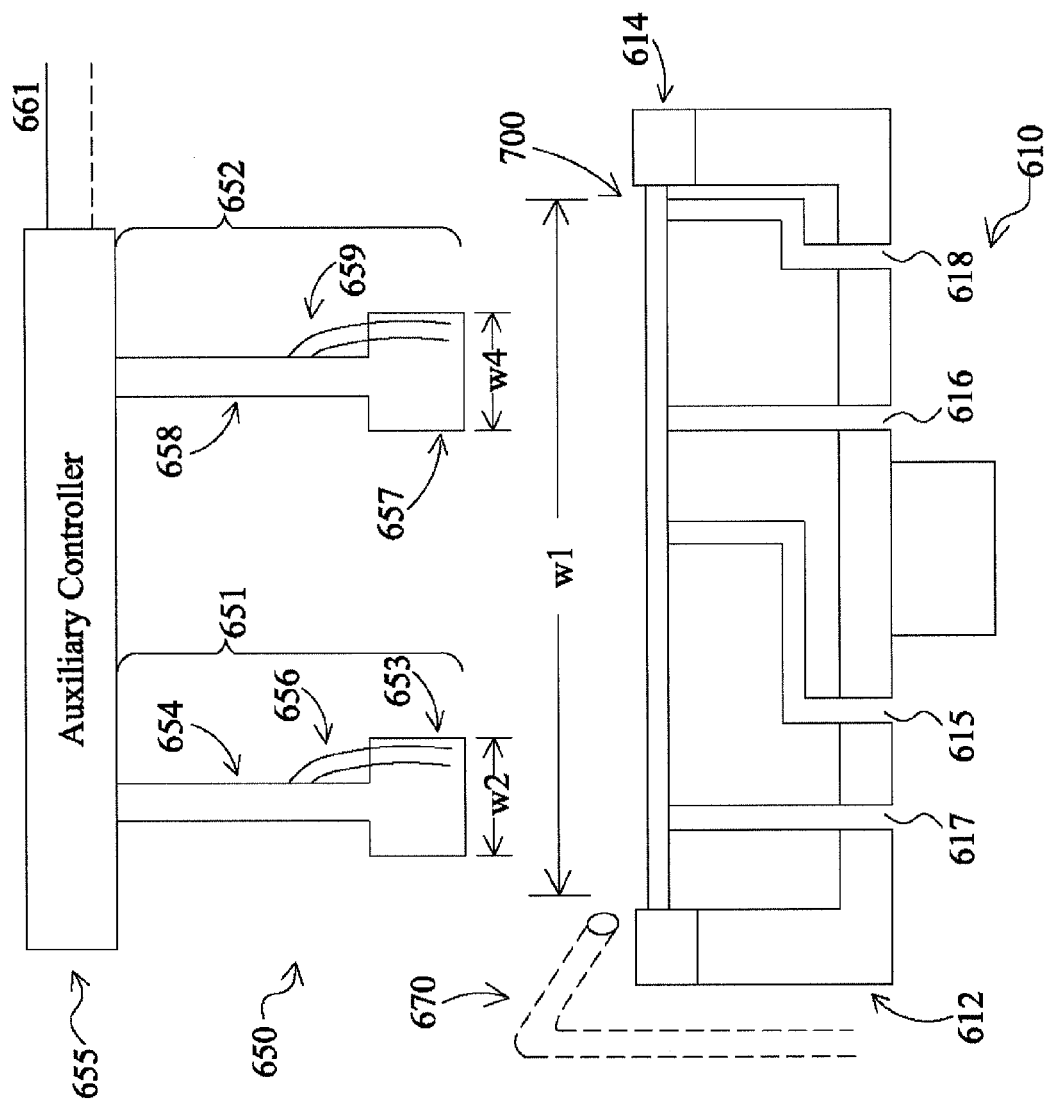
FIG. 14 is a detailed view of an auxiliary polishing system of FIG. 1 in accordance with various embodiments of the present disclosure.

An auxiliary polishing system 650 installed in the polishing system 60 is shown in FIG. 6, and a detailed view thereof is shown in FIG. 14. In some embodiments, the polishing head 610 serves dual purposes in the polishing system 60. In the first polishing process (main polishing process), the polishing head 610 holds the semiconductor wafer 700, presses the semiconductor wafer 700 against the main polishing pad 600, spins the semiconductor wafer 700, translates the semiconductor wafer 700 over the face of the main polishing pad 600, and performs zone polish control through the applicators 615-618. In a second polishing process (auxiliary polishing process), as part of the auxiliary polishing system 650, the polishing head 610 acts as a table holding the semiconductor wafer 700 toward auxiliary polishing units 651 and 652, while at least one auxiliary polishing unit 651, 652, polishes at least one zone and/or at least one area of the semiconductor wafer 700. In the second polishing process, the polishing head 610 holds the semiconductor wafer 700, spins the semiconductor wafer 700, and/or translates the semiconductor wafer 700 in three dimensions.

Two auxiliary polishing units 651, 652 are shown in FIG. 14. Embodiments including only one, two, three, or more than three auxiliary polishing units are contemplated herein. An auxiliary polishing pad 653 of the auxiliary polishing unit 651 is attached to an axle 654, which is attached to an auxiliary controller 655. In some embodiments, a polishing surface of the auxiliary polishing pad 653 includes material similar to the material of the main polishing pad 600, such as polyurethane. A polishing surface of the auxiliary polishing pad 653 is circular, for example. Width of the polishing surface of the auxiliary polishing pad 653, which may also be diameter for a circular shape, is indicated as width $w_2$ in FIG. 14. The width $w_2$ of the polishing surface of the auxiliary polishing pad 653 is shorter than the width $w_1$ of the semiconductor wafer 700. The width $w_2$ is shorter than about half the width $w_1$, for example. The width $w_2$ is between about ¼ to about ⅓ of the width $w_1$, or even shorter than about ¼ of the width $w_1$. Width of a polishing face of a second auxiliary polishing pad 657 of the auxiliary polishing unit 652, which may also be diameter for a circular shape, is indicated as width $w_4$ in FIG. 14. The width $w_4$ is shorter than the width $w_1$ of the semiconductor wafer 700, and in some embodiments is about the same as the width $w_2$. In some embodiments, the width $w_4$ is different from the width $w_2$ of the auxiliary polishing pad 653. In some embodiments, the auxiliary polishing pad 657 has the same shape as, or a different shape than, the auxiliary polishing pad 653. In some embodiments, polishing surfaces of the auxiliary polishing pads 653, 657, which are affected by polishing material and/or texturing, are the same or different.

In some embodiments, the auxiliary controller 655, which controls the auxiliary polishing units 651, 652 to perform the second polishing process, includes electronics, and electrical and mechanical systems for controlling rotation of the axles 654, 658 and the auxiliary polishing pads 653, 657 and for controlling translation of the axles 654, 658 and the auxiliary polishing pads 653, 657 in three dimensions before, during, and after the second polishing process. In some embodiments, the auxiliary controller 655 includes motors for spinning the auxiliary polishing units 651, 652. In some embodiments, the motors are controlled electronically to spin at variable and/or constant speeds before, during, and after the second polishing process. In some embodiments, the auxiliary controller 655 further includes levers and/or pistons for applying downward force on the auxiliary polishing units 651, 652 to apply pressure on the zone(s) and/or area(s) to be polished in the second polishing process.

A signal line (or bus) 661 electrically connects the auxiliary controller 655 to the metrology tools 630, so that the auxiliary controller 655 automatically translates metrology data (layer thickness, contour profile) of the semiconductor wafer 700 into polishing steps of the second polishing process. Configurations in which the auxiliary controller 655 is electrically connected to the system controller 620 are also contemplated herein. In some embodiments, the system controller 620 interprets the metrology data from the metrology tools 630, and sends polishing commands to the auxiliary controller 655, such that the auxiliary controller 655 need not be directly electrically connected to the metrology tools 630 to perform the second polishing process. In such a configuration, in some embodiments, the auxiliary controller 655 does not include interpreter hardware and/or software for intelligently handling feedback data from the metrology tools 630, but relies on the system controller 620 for polishing variables, such as spin rates, pressures, stutter rates, and/or displacements and paths for the auxiliary polishing units 651, 652. In some embodiments, the system controller 620 includes hardware (e.g., a processor, memory, logic circuits, and the like).

For a chemical mechanical polishing (CMP) system, the second polishing process includes introduction of a chemical slurry, such as that described above, on the face of the semiconductor wafer 700 under process. The chemical slurry is introduced in various ways. As one example, an auxiliary slurry delivery system 670 shown in phantom in FIG. 14 may deliver the chemical slurry to the face of the semiconductor wafer 700 through a tube and a pump. In some embodiments, the auxiliary slurry delivery system 670 is installed in and through the polishing head 610, with evenly spaced outlets along a radius of the face of the polishing head 610, for example. Another slurry delivery system is integral to the auxiliary polishing units 651, 652, where the chemical slurry is delivered into the auxiliary polishing pads 653, 657 through tubes 656, 659, for example. In some embodiments, the two delivery systems are used individually or in conjunction to introduce the chemical slurry onto the face of the semiconductor wafer 700 during polishing of the zone(s) and/or area(s) in the second polishing process. In some embodiments, the auxiliary controller 655 is configured to control slurry variables, including delivery rate(s), slurry mix ratios, and the like of the chemical slurry delivered by any or all of the delivery systems 670, 656, and 659 described herein. In some embodiments, the slurry variables are controlled by the system controller 620, for example.

In some embodiments, the polishing head 610 is configured to be rotated, so that the face of the semiconductor wafer 700 under process can face away from the main polishing pad 600 during the second polishing process. For example, the polishing head 610 is rotated 180 degrees, so that the polishing head 610 is inverted relative to its original position during the first polishing process. Other angles of rotation are also contemplated, such as 90 degrees clockwise or counterclockwise. In some embodiments, a first positioning mechanism 680 (FIG. 6) rotates the polishing head 610 away from the main polishing pad 600, for example, so that the polishing head 610 faces up. In some embodiments, the face of the semiconductor wafer 700 after rotating the polishing head 610 away from the main polishing pad 600 has substantially the same orientation as the face of the main polishing pad 600. In some embodiments, the face of the polishing head 610 is oriented in such a way that a surface normal (normal vector) thereof is substantially parallel to and opposite the direction of gravity, for example. Orientations at a slight tilt from parallel are also contemplated, which may aid drainage of chemical slurry from the semiconductor wafer 700.

In some embodiments, the polishing head 610 is further rotated and/or translated away from the main polishing pad 600, such that the polishing head 610 is not directly above the main polishing pad 600. In some embodiments, the translating is performed by the first positioning mechanism 680, and the rotating is performed by a second positioning mechanism 690 connected to the first positioning mechanism 680 according to a signal 621, for example. Moving the polishing head 610 away from the main polishing pad 600 allows the main polishing pad 600 to continue processing subsequent wafers under precise slurry volume control without excess slurry dripping onto the main polishing pad 600 from above as the polishing head 610 is involved in the second polishing process. Configurations in which multiple polishing heads 610 are included in the polishing system 60 to accommodate for a higher numbers of wafers under process are contemplated herein. Whereas a traditional polishing system may include three polishing pads and three polishing heads, for example, a polishing system similar to the polishing system 60 may include three polishing pads and six polishing heads, so as not to reduce throughput as each wafer is polished twice.

Embodiments in which the auxiliary polishing system 650 includes the cleaning sub-system 400 shown in FIG. 4 are also contemplated herein.

Figure 15:
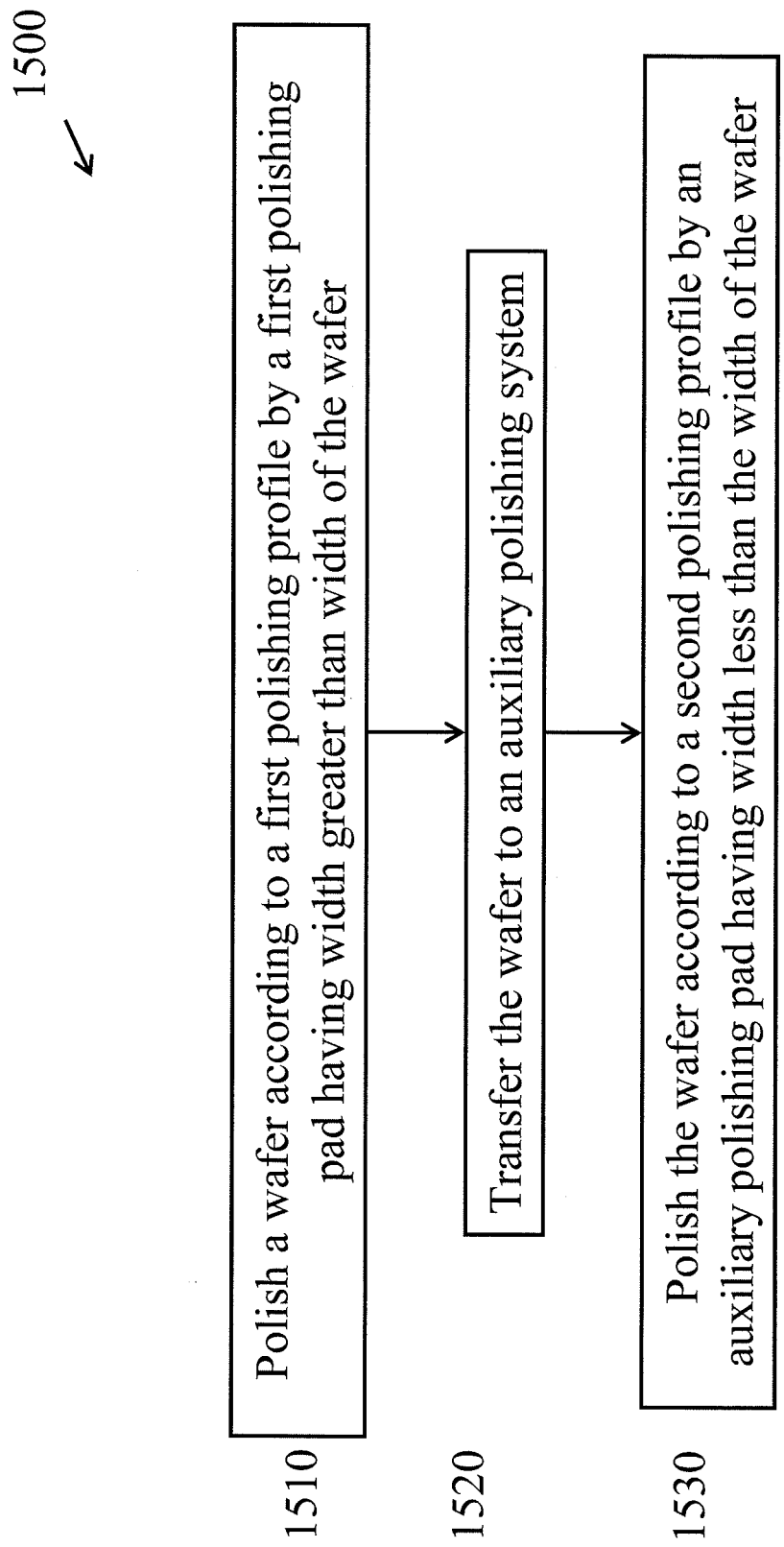
FIG. 15 is a flowchart of a full polishing process in accordance with various embodiments of the present disclosure.
Figure 16:
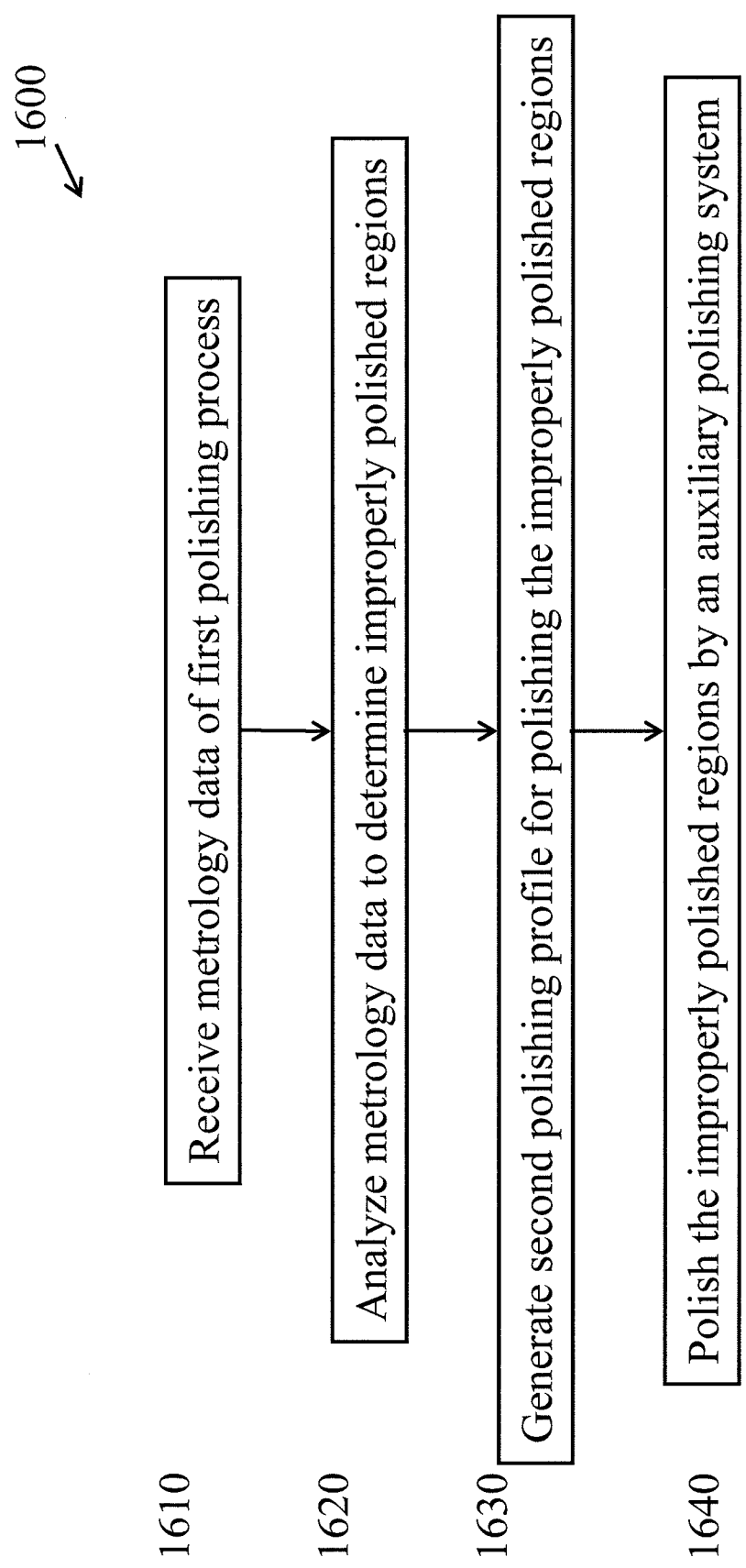
FIG. 16 is a flowchart of a second polishing process in accordance with various embodiments of the present disclosure.

Flowcharts of a full polishing process 1500 and a second polishing process 1600 in accordance with various embodiments of the present disclosure are shown in FIG. 15 and FIG. 16, respectively. The semiconductor wafer 700 is initially polished using a first polishing profile in block 1510, which is considered a first polishing process by a first polishing pad having a width greater than the semiconductor wafer 700. The first polishing process is completed using the polishing head 610 and the main polishing pad 600, as described above. The semiconductor wafer 700 is then transferred to an auxiliary polishing system, such as the auxiliary polishing system 650 shown in FIG. 6 and FIG. 14, in block 1520. An auxiliary polishing pad, such as the auxiliary polishing pad 653 of the auxiliary polishing unit 651 shown in FIG. 14 is used to polish the semiconductor wafer 700 according to a second polishing profile in block 1530, which is considered a second polishing process by an auxiliary polishing pad having a width less than the semiconductor wafer 700.

In some embodiments, the second polishing process 1600 shown in FIG. 16 is the same as the block 1530 in FIG. 15. In some embodiments, the second polishing process 1600 shown in FIG. 16 begins after completing the first polishing process, and transferring the semiconductor wafer 700 to the auxiliary polishing system 650 in block 1520, for example. In some embodiments, metrology data, such as the metrology data generated by the metrology tools 630 shown in FIG. 6 is received by the system controller 620 and/or the auxiliary controller 655 in block 1610. In some embodiments, the metrology data is received after completion of the first polishing process. In accordance with various embodiments of the present disclosure, the metrology data is received at any time during the full polishing process 1500, such as during the first polishing process, or during the transferring of the semiconductor wafer 700 to the auxiliary polishing system 650. As described above, in some embodiments, the metrology data includes characteristics including layer thickness contours, and/or layer roughness data. In some embodiments, the characteristics are mapped to coordinates of the semiconductor wafer 700.

In block 1620, the received metrology data is analyzed to determine improperly polished regions of the semiconductor wafer 700. In some embodiments, the improperly polished regions exhibit thickness and/or surface texture that differs from expected thickness and/or texture programmed into the first predefined polishing profile. In some embodiments, using standard techniques, such as edge detection, the improperly polished regions of the semiconductor wafer 700 is determined. In some embodiments, the metrology data is pixel-level data, such that the improperly polished regions is pixel-sized at a finest granularity. Using image processing techniques, the pixel-sized regions are grouped into larger regions in some embodiments, such as the ring zones described in reference to FIGS. 8-12, or the localized areas shown in FIG. 13. As an example, a ring zone is loosely defined by an inner radius and an outer radius. Then, a central radius, or track, is obtained by averaging the inner and outer radii, for example. Width of the track is obtained by subtracting the inner radius from the outer radius, for example. Thus, on a 300 mm wafer, a track of width about 40 mm and center radius about 90 mm is found corresponding to an inner radius of about 70 mm and an outer radius of about 110 mm, as only one example. In some embodiments, the track corresponds to one or more of the applicators 615-618, such as the outer zone applicator 617, for example.

In some embodiments, the improperly polished region(s) has defined shape and contour, and a second predefined polishing profile is generated accordingly in block 1630 to improve planarity and/or surface smoothness uniformity over the semiconductor wafer 700 surface. Taking again the example of a ring zone, having found a track width and center radius of the ring zone, a second polishing profile that defines position of the auxiliary polishing pad, applied pressure(s), and/or polishing time and the like is generated to planarize and/or smooth the improperly polished ring zone.

In accordance with various embodiments of the present disclosure, auxiliary polishing pads of the auxiliary polishing system 650 have different sizes. For example, auxiliary polishing pad widths range from about 25 mm to about 100 mm. In some embodiments, the track width is taken into consideration when selecting the auxiliary polishing pad. Using the previous example of a track width of 40 mm, an auxiliary polishing pad of width greater than 40 mm and shorter than about 70 mm is selected manually or automatically as part of the second polishing profile. In some embodiments, auxiliary polishing pads of the auxiliary polishing system 650 all have the same size, and no selection based on pad size, either automatic or manual, need be performed. Embodiments in which the auxiliary polishing pads have different polishing surfaces, such as different polishing materials, and are selectable according to polishing material defined in the desired second polishing profile, are also contemplated herein.

Using the second polishing profile generated according to block 1630 of FIG. 16, in some embodiments the auxiliary polishing system 650 polishes the improperly polished region(s) in block 1640. To polish the semiconductor wafer 700, the auxiliary polishing system 650 spins the semiconductor wafer 700 and spins the auxiliary polishing pad(s) 653, 657. The auxiliary polishing system 650 further positions the auxiliary polishing pad(s) 653, 657 over the improperly polished region(s), and lowers the auxiliary polishing pad(s) 653, 657 until contact is made with the semiconductor wafer 700. Chemical slurry is applied, and/or pressure is varied between the auxiliary polishing pad(s) 653, 657 and the semiconductor wafer 700. The above steps are not necessarily performed in the order described. In some embodiments, the auxiliary polishing system 650 holds the semiconductor wafer 700 while the auxiliary polishing pad(s) 653, 657 polish the semiconductor wafer 700. For the localized areas shown in FIG. 13, holding the semiconductor wafer 700 stationary is preferable, and the auxiliary polishing pads 653, 657 are positioned over centers of the localized areas, or are translated in patterns to provide uniform polishing coverage over the localized areas. For two or more improperly polished regions, the improperly polished regions are polished simultaneously, sequentially, or a combination of the two (for three or more improperly polished regions).

Figures 11, 12, 13:
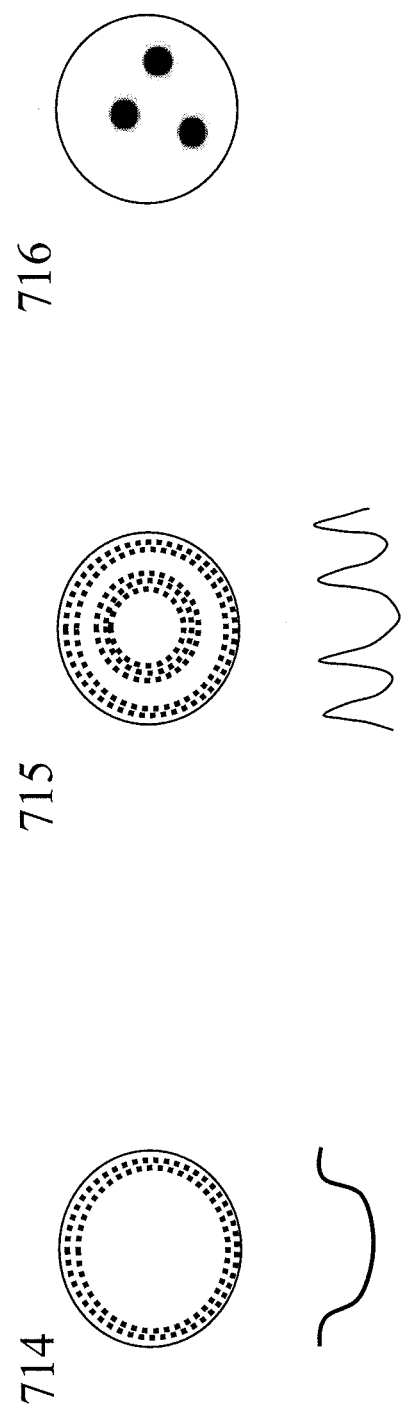

In some embodiments, the localized areas in FIG. 13 are polished while the semiconductor wafer 700 is spinning. Knowing the spin rate of the semiconductor wafer 700, radii corresponding to centers of the localized areas, and radial lengths of the localized areas, stutter frequencies are calculated, such that the auxiliary polishing pad(s) 651, 652 remain mostly stationary, and apply short bursts of pressure as the localized area(s) pass by the auxiliary polishing pad(s) 651, 652. For example, if an improperly polished area has a center located at an 80 mm radius from the center of the semiconductor wafer 700, and average radius of 15 mm, and the semiconductor wafer 700 is spun at 60 revolutions per minute (rpm), the improperly polished area passes the auxiliary polishing pad 651 (for example) once per second. The auxiliary polishing pad 651 is then lowered and raised with a stutter frequency of 1 Hz. Contact time for each pulse in which the auxiliary polishing pad 651 is applied pressure to polish the face of the semiconductor wafer 700 is set in various manners, including time required for the improperly polished area to pass the area of the auxiliary polishing pad 651. If radius of the auxiliary polishing pad 651 is about 25 mm, time for the improperly polished area to pass through the length of the auxiliary polishing pad is approximated to about $D_{PAD}/V_{CENTER}$, where $D_{PAD}$ is diameter of the auxiliary polishing pad 651 (50 mm in the example given), and $V_{CENTER}$ is linear velocity of the center of the improperly polished area. In the example given, $D_{PAD}$ is 50 mm (25 mm*2), and $V_{CENTER}$ is about 503 mm/s (2*π*80 mm/s), which gives a pulse width of approximately 1/10 second, or 100 milliseconds.

The second polishing process 1600 is performed as part of the full polishing process 1500, as described above. In accordance with various embodiments of the present disclosure, the second polishing process 1600 is performed independently, for example as part of a batch rework system, where the metrology data is saved in a server or portable storage medium, for example, and downloaded from the server during rework (the second polishing process) of the semiconductor wafer 700. In some embodiments, the auxiliary polishing system 650 is part of the polishing system 60. In some embodiments, the auxiliary polishing system 650 is an independent polishing system, such as a rework station, for example. In such an independent polishing system, a polishing head similar to the polishing head 610 is utilized to hold the semiconductor wafer 700. In some embodiments, a wafer table is utilized to hold the semiconductor wafer 700 while auxiliary polishing units similar to the auxiliary polishing units 651, 652 perform a second polishing process on the semiconductor wafer 700. This type of configuration is appropriate when the semiconductor wafer 700 is to be taken offline prior to undergoing the second polishing process.

In FIGS. 6 and 14, the polishing head 610 is shown facing up, while the auxiliary polishing units 651, 652 face down. Embodiments in which the polishing head 610 faces down, while the auxiliary polishing units 651, 652 face up are also contemplated herein. In this configuration, the polishing head 610 lifts the semiconductor wafer 700 from the main polishing pad 600, translates the semiconductor wafer 700 to a position over the auxiliary polishing units 651, 652, and lowers the semiconductor wafer 700 and/or raises the auxiliary polishing units 651, 652 to make contact and polish the semiconductor wafer 700 through the second polishing process described above. No rotation of the polishing head 610 is required in such a configuration.

Embodiments where the polishing system 60 does not include the main polishing pad 600 and the auxiliary polishing system 650 polishes the entire face of the semiconductor wafer 700 are contemplated herein. In some embodiments, the auxiliary polishing pad 651 has a width similar to the width of the semiconductor wafer 700, for example. Then, block 1510 of FIG. 15 is modified to use the auxiliary polishing pad 651 having the width similar to the width of the semiconductor wafer 700. Block 1520 is removed from the full polishing process 1500, and a second auxiliary polishing pad, such as the auxiliary polishing pad 652, having width shorter than the width of the semiconductor wafer 700 is used to polish the semiconductor wafer 700 using the second predefined polishing profile.

Figure 17:
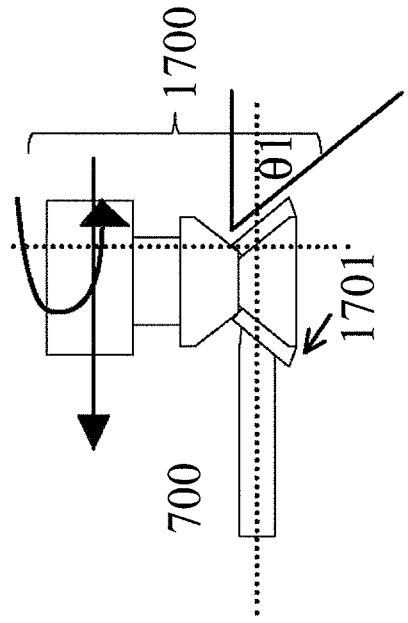
FIGS. 17 to 20 are diagrams of an auxiliary bevel polishing unit performing bevel polishing in accordance with various embodiments of the present disclosure.
Figure 18:
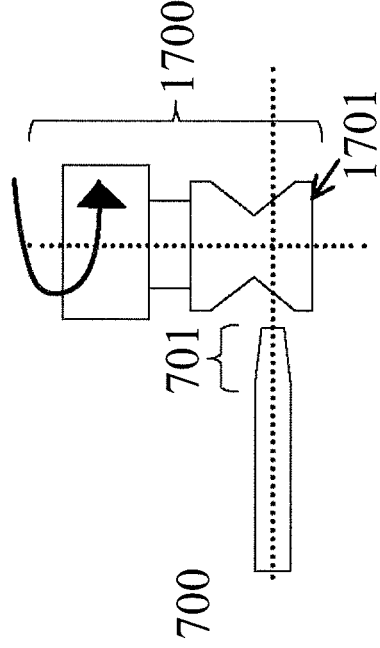
Figure 19:
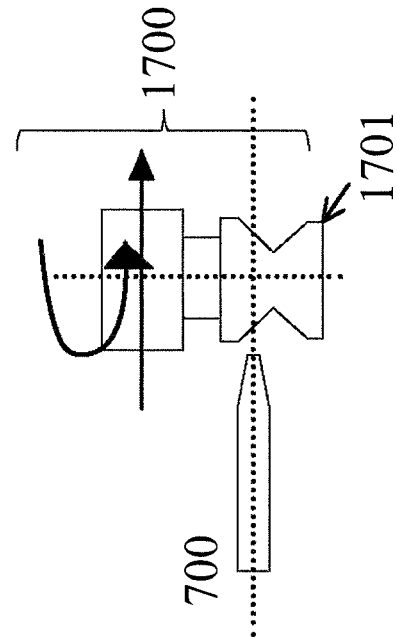
Figure 20:
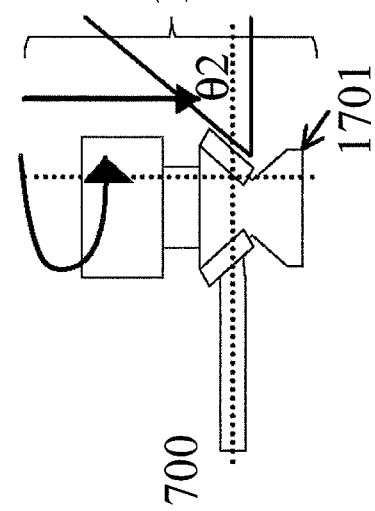

In some embodiments, the auxiliary polishing system 650 is also used as a bevel polisher in accordance with various embodiments of the present disclosure. An auxiliary bevel polishing unit 1700 and bevel polishing scheme are depicted in FIGS. 17 to 20. The auxiliary bevel polishing unit 1700 includes a bevel polishing pad 1701. To polish a bevel region 701 of the semiconductor wafer 700, the auxiliary bevel polishing unit 1700 spins the bevel polishing pad 1701 as shown in FIG. 17. The spinning bevel polishing pad 1701 is translated toward the semiconductor wafer 700 to make contact with the bevel region 701 as shown in FIG. 18. In some embodiments, a lower inclined portion of the bevel polishing pad 1701 having a first angle θ1 relative to the face of the semiconductor wafer 700 polishes the bevel region 701 first. Subsequently, as shown in FIG. 19, the bevel polishing pad 1701 is translated downward, such that an upper inclined portion of the bevel polishing pad 1701 having a second angle θ2 relative to the face of the semiconductor wafer 700 polishes the bevel region 701. In some embodiments, the bevel polishing pad 1701 is moved toward the center of the semiconductor wafer 700 to bring the bevel region 701 of the semiconductor wafer 700 back to the meeting point of the upper and lower inclined portions, then moved up to polish the bevel region 701 by the lower inclined portion again. In some embodiments, these steps are iterated prior to translating the bevel polishing pad 1701 away from the semiconductor wafer 700 as shown in FIG. 20. Embodiments where the bevel polishing pad 1701 and the auxiliary polishing pad 651 are the same pad are also contemplated herein. For example, a downward-facing surface of the auxiliary polishing pad 651 polishes the face of the semiconductor wafer 700, and a side surface of the same auxiliary polishing pad 651 polishes the bevel of the semiconductor wafer 700.

The polishing system 60 including the auxiliary polishing system 650, by using the polishing head 610 as a portable wafer table, saves space and rework time over traditional polishing systems. The auxiliary polishing units 651, 652 of the auxiliary polishing system 650 allow for numerous polishing profiles to be used, and can be tied in with the metrology data provided by the metrology tools 630 to provide automated, in line rework without taking the semiconductor wafer 700 offline. The auxiliary bevel polishing unit 1200 and the cleaning unit 1600 in the auxiliary polishing system 650 also save time, eliminating the need for offline bevel polishing and cleaning stations. The semiconductor wafer 700 can be polished, bevel polished, and cleaned in the same station, which saves space and greatly reduces wafer transfer time. The polishing system 60 saves space and time, and has flexible polishing profile control, which translates into an increase in both yield and throughput.

In accordance with various embodiments of the present disclosure, a polishing system for polishing a semiconductor wafer includes a wafer support for holding the semiconductor wafer, the semiconductor wafer having a first diameter, and a first polishing pad for polishing a region of the semiconductor wafer, the first polishing pad having a second diameter shorter than the first diameter.

In accordance with various embodiments of the present disclosure, a polishing method includes providing a semiconductor wafer having a first diameter on a wafer support, and polishing a region of the semiconductor wafer by at least one polishing pad having a second diameter shorter than the first diameter.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A polishing method comprising:
providing a semiconductor wafer having a first diameter on a wafer support;
polishing a first region of the semiconductor wafer using a first polishing pad;
measuring a thickness profile of the polished first region;
generating a polishing profile based on the measured thickness profile; and
polishing a second region of the semiconductor wafer using at least one second polishing pad having a second diameter shorter than the first diameter based on the polishing profile, wherein the polishing of the second region comprises:

polishing a localized region less than an entirety of the semiconductor wafer, and maintaining the semiconductor wafer in a same wafer support used during polishing the first region.

2. The polishing method of claim 1, wherein the polishing of the first region of the semiconductor wafer comprises polishing the first region of the semiconductor wafer using the first polishing pad having a third diameter greater than the first diameter.

3. The polishing method of claim 1, wherein the step of polishing of the second region of the semiconductor wafer using the at least one second polishing pad comprises polishing the second region of the semiconductor wafer by at least two second polishing pads.

4. The polishing method of claim 1, further comprising: delivering slurry to the second region through the at least one second polishing pad.

5. The polishing method of claim 1, further comprising: cleaning the semiconductor wafer on the wafer support.

6. The polishing method of claim 1, wherein the providing of the semiconductor wafer comprises providing the semiconductor wafer on a polishing head.

7. The polishing method of claim 1, wherein the polishing of the second region of the semiconductor wafer comprises polishing a ring-shaped region of the semiconductor wafer having an outer diameter shorter than the first diameter.

8. The polishing method of claim 1, wherein the polishing of the second region comprises polishing the second region of the semiconductor wafer using at least one polishing pad having an outer diameter shorter than about half the first diameter.

9. The polishing method of claim 1, further comprising: cleaning the semiconductor wafer on the wafer support; and
polishing the second region of the semiconductor wafer on the wafer support using a third polishing pad having a diameter shorter than the first diameter, wherein a chord passing through a center of the third polishing pad and through a center of the at least one second polishing pad is shorter than the first diameter.

10. The polishing method of claim 1, wherein the step of polishing of the second region of the semiconductor wafer comprises polishing a central region of the semiconductor wafer having an outer diameter shorter than the first diameter.

11. The polishing method of claim 1, wherein the step of polishing of the second region of the semiconductor wafer comprises polishing a plurality of ring-shaped regions of the semiconductor wafer having an outer diameter shorter than the first diameter.

12. The polishing method of claim 1, wherein the polishing of the first region of the semiconductor wafer comprises varying a rotational speed of the first polishing pad during polishing of the first region.

13. A polishing method comprising:
polishing a first region of a semiconductor wafer using a first polishing pad, wherein the semiconductor wafer has a first diameter, and the first polishing pad has a second diameter larger than the first diameter, and
polishing a second region of the semiconductor wafer using a second polishing pad having a third diameter shorter than the first diameter, wherein the polishing of the second region comprises:
receiving layer thickness contours of the polished first region;
generating a polishing profile based on the layer thickness contours;
polishing the second region based on the polishing profile, wherein the polishing of the second region comprises polishing less than an entirety of the semiconductor wafer, and
maintaining the semiconductor wafer in a same wafer support used during polishing the first region.

14. The polishing method of claim 13, wherein the generating of the polishing profile comprises generating the polishing profile based on one or more of a pressure of the second polishing pad, a polishing duration of the second polishing pad or a polishing rate of the second polishing pad.

15. The polishing method of claim 13, further comprising: polishing a third region of the semiconductor wafer using a third polishing pad having a fourth diameter shorter than the first diameter.

16. The polishing method of claim 13, further comprising: rotating the wafer support and the semiconductor wafer away from the first polishing pad, and
rotating the wafer support and the semiconductor wafer toward the second polishing pad.

17. The polishing method of claim 13, further comprising: delivering a slurry to the first region, or
delivering the slurry to the second region through the second polishing pad.

18. The polishing method of claim 13, wherein the polishing of the second region of the semiconductor wafer comprises polishing a ring-shaped region of the semiconductor wafer having an outer diameter shorter than the first diameter.

19. The polishing method of claim 13, wherein the polishing of the second region comprises:
polishing the second region of the semiconductor wafer using the second polishing pad having an outer diameter shorter than about half of the first diameter.

20. The polishing method of claim 13, wherein the receiving of the layer thickness contours comprises measuring a layer thickness across the first region using a metrology tool.

* * * * *